(12) United States Patent
Auernheimer et al.

(10) Patent No.: US 7,365,428 B2
(45) Date of Patent: Apr. 29, 2008

(54) ARRAY CAPACITOR WITH RESISTIVE STRUCTURE

(75) Inventors: Joel A. Auernheimer, Phoenix, AZ (US); Nicholas L. Holmberg, Gilbert, AZ (US); Kaladhar Radhakrishnan, Chandler, AZ (US); Dustin P. Wood, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 324 days.

(21) Appl. No.: 10/971,379

(22) Filed: Oct. 22, 2004

(65) Prior Publication Data

US 2006/0087030 A1    Apr. 27, 2006

(51) Int. Cl.
*H01L 23/34* (2006.01)
*H01L 23/495* (2006.01)
*H01L 27/06* (2006.01)
*H01L 27/07* (2006.01)
*H01L 21/50* (2006.01)
*H01L 21/48* (2006.01)
*H01L 21/44* (2006.01)

(52) U.S. Cl. .............. 257/724; 257/723; 257/E27.025; 257/E27.045; 257/E23.057

(58) Field of Classification Search ................ 257/734, 257/737, 738, 723–724, E27.025, E27.045, 257/E23.057; 438/107, 381
See application file for complete search history.

(56) References Cited

U.S. PATENT DOCUMENTS 6,021,050 A * 2/2000 Ehman et al. .............. 361/793

| | | | |
|---|---|---|---|
| 6,218,729 B1* | 4/2001 | Zavrel, Jr. et al. .......... | 257/698 |
| 6,274,937 B1* | 8/2001 | Ahn et al. ................... | 257/777 |
| 6,535,398 B1* | 3/2003 | Moresco ..................... | 361/792 |
| 6,657,275 B1 | 12/2003 | Chung et al. | |
| 6,714,422 B2* | 3/2004 | Okubora et al. ............ | 361/793 |
| 2004/0178508 A1* | 9/2004 | Nishimura et al. ......... | 257/778 |

OTHER PUBLICATIONS

Beattie et al., "IC Analyses Including Extracted Inductance Models," ACM, Inc., 1999, 6 pgs.
Li et al., "Distributed Models for Multi-Terminal Capacitors—Using 2D Lossy Transmission-Line Approach," IEEE, Electronic Components and Technology Conference, 2001, 4 pgs.
"Electrical Performance of Packages," National Semiconductor Corporation, www.national.com, 2002, 6 pgs.

* cited by examiner

*Primary Examiner*—Luan Thai
(74) *Attorney, Agent, or Firm*—Schwabe, Williamson & Wyatt, P.C.

(57) ABSTRACT

An apparatus comprises a first plurality of contacts disposed on a first side of the apparatus, adapted to engage with a first corresponding plurality of contacts on an external integrated circuit package. The apparatus further comprises a plurality of capacitive storage structures selectively coupled to the first plurality of contacts, one or more traces, and a second plurality of contacts disposed on the first side. The second plurality of contacts are adapted to engage with a second corresponding plurality of contacts on the external integrated circuit package, wherein at least two of the second plurality of contacts are adapted to be coupled to at least a first trace of the one or more traces to form a first resistive structure.

22 Claims, 10 Drawing Sheets

ARRAY CAPACITOR WITH RESISTIVE STRUCTURE

FIELD OF THE INVENTION

Embodiments of the present invention relate in general to the field of integrated circuits and, in particular, packaging of integrated circuits.

BACKGROUND OF INVENTION

Packaging of integrated circuits in general has associated with it several functions. Such functions may include providing mechanical support for an integrated circuit device and providing the means of removing heat generated by the integrated circuit. Additionally, the functions may include providing the means for delivery of signals and power to/from the integrated circuit.

A poorly designed package may have negative effects on various aspects of an integrated circuit. For example, while packaging in general cannot add to the performance of a circuit design embodied in an integrated circuit, packaging may have adverse effects on a circuit design's performance. These adverse effects may result, for example, in limiting the maximum frequency at which a processor housed by a poorly designed package may be operated. Another negative effect may be an increase in power that may be consumed by an integrated circuit in a poorly designed package.

BRIEF DESCRIPTION OF DRAWINGS

Embodiments of the present invention will be described referencing the accompanying drawings in which like references denote similar elements, and in which.

DETAILED DESCRIPTION OF THE EMBODIMENTS

Various aspects of illustrative embodiments of the invention will be described using terms commonly employed by those skilled in the art to convey the substance of their work to others skilled in the art. However, it will be apparent to those skilled in the art that alternate embodiments may be practiced with only some of the described aspects. For purposes of explanation, specific numbers, materials, and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

The phrase "in one embodiment" is used repeatedly. The phrase generally does not refer to the same embodiment; however, it may. The terms "comprising", "having" and "including" are synonymous, unless the context dictates otherwise. The phrase "contacts", "pads" and "contact pads" are synonymous and meant to indicate a conductive interface to a device.

Figure 1:
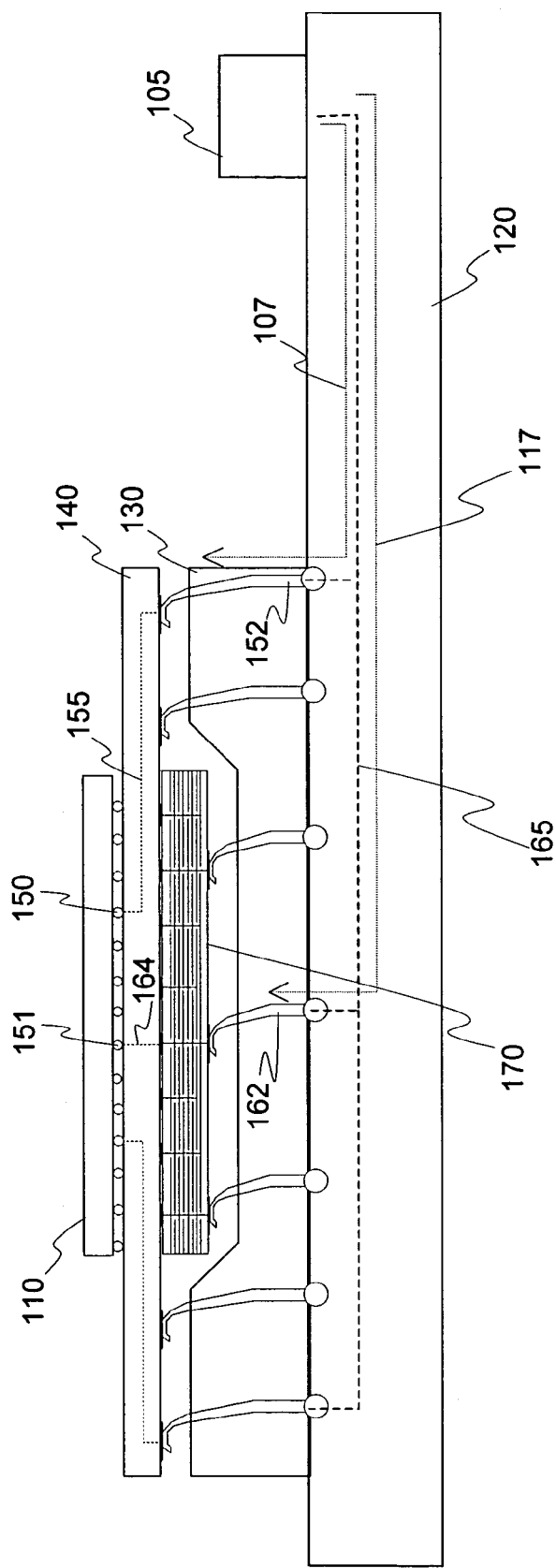
FIG. 1 illustrates a portion of a system utilizing an array capacitor, in accordance with one embodiment.

FIG. 1 illustrates a portion of a system utilizing an array capacitor, in accordance with one embodiment. In this system, a voltage regulator 105 provides power to an integrated circuit 110. The power is routed through multiple paths. These paths include a first path 107 running through a first substrate 120, e.g. a printed circuit board, to a land grid array socket 130, and then, through a lead 152 to a second substrate, e.g. integrated circuit substrate 140. For the embodiment, this first path 107 is routed through the integrated circuit substrate 140 in part, horizontally 155, and then to a bump 150 on the integrated circuit 110. In the embodiment illustrated, a second path 117 is also utilized. Second path 117 is routed in part, horizontally 165 in the first substrate 120 for a greater distance than a similar portion of the routing of the first path 107. The second path 117 is then routed to the land grid array socket 130 and through a lead 162 to an array capacitor 170. The second path 117 continues through the array capacitor 170 to the integrated circuit substrate 140. The second path 117 is routed 164 through the integrated circuit substrate 140 with little, if any, horizontal component to bump 151 on integrated circuit 110. The first and second paths 107 117 may provide an ability to supply power to the integrated circuit 110, individually or in combination.

Lead 162 may be of different dimension than that of lead 152. This may be to accommodate the difference in height between the substrate 140 upon which the land grid array may be mounted and the pads on the integrated circuit substrate 140 and the pads on the array capacitor 170. Thus, the height of lead 162 may be shorter than that of lead 152 to accommodate the height of the array capacitor 170.

Figure 2:
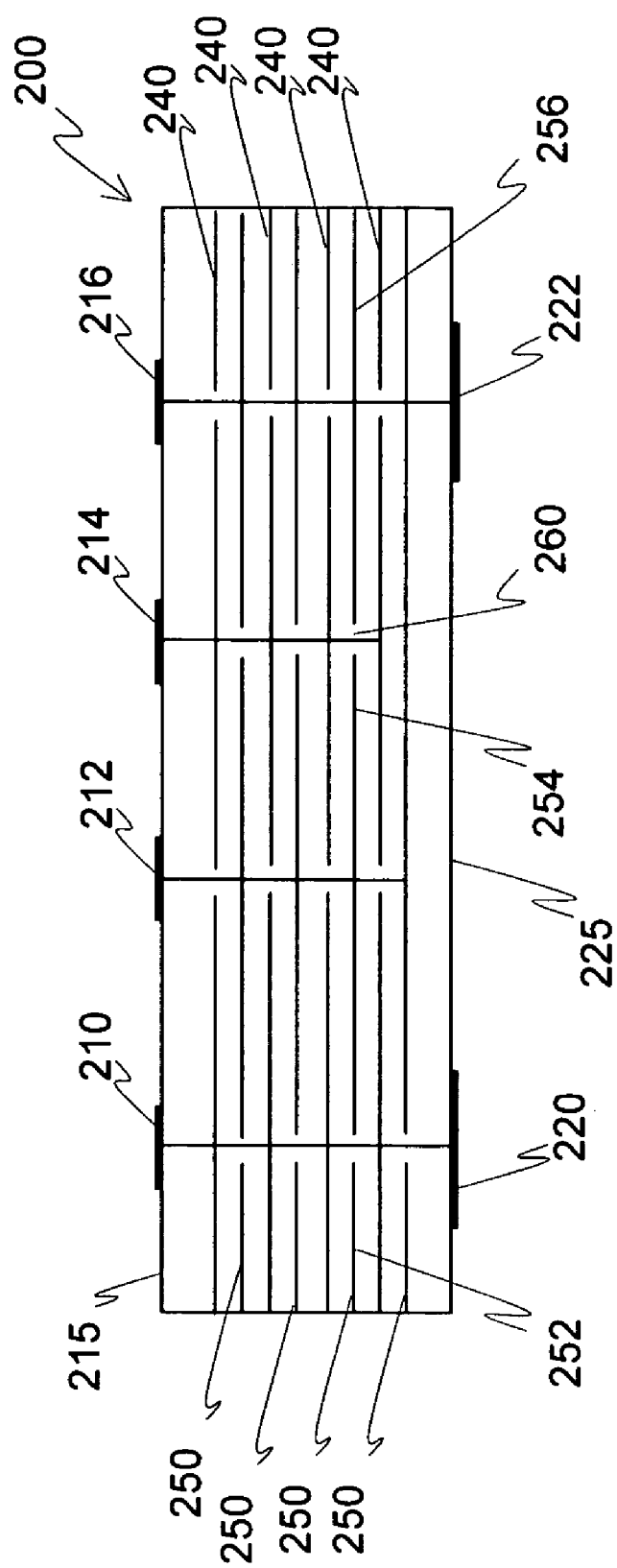
FIG. 2 illustrates a cross sectional view of an array capacitor, in accordance with one embodiment.

FIG. 2 illustrates a cross sectional view of an array capacitor 200, in accordance with one embodiment. A first set of pads 210-216 on a first side 215 of the array capacitor 200 may be utilized as contacts for the array capacitor 200. In this embodiment, the first set of pads 210-216 may be used to interface the array capacitor 200 to an integrated circuit package. A first subset 210 214 of the first set of pads 210-216 may be coupled to a first supply voltage. A second subset 212 216 of the first set of pads 210-216 may be coupled to a second supply voltage. A second set of pads 220 222 on a second side 225 of the array capacitor 200 may also be utilized as contacts for the array capacitor 200. In this embodiment, the second set of pads 220 222 may be used to interface the array capacitor 200 to a socket. For example, the second set of pads 220 222 may be used to interface the array capacitor to a corresponding set of leads on a land grid array (LGA) socket. Note that the number of pads in the first set of pads 210-216 may be greater than the number of pads in the second set of pads 220 222. This higher number of pads in the first set of pads 210-216 may reflect a greater density of contacts on the integrated circuit package vis-à-vis the leads of the LGA socket.

The array capacitor 200 comprises capacitive storage elements. In the embodiment illustrated in FIG. 2, the capacitive storage elements of the array capacitor are conductive planes 240 250, which may also be referred to as "capacitive storage planes". As further depicted, each of the conductive planes 240 250 may be parallel to the other ones of the conductive planes 240 250. When the array capacitor 200 is utilized in a system, for example as illustrated in FIG. 1, a first plurality of the conductive planes 240 may be electrically coupled to a ground voltage. For example, the first plurality of conductive planes 240 may be coupled to pad 220. Pad 220 may interface with a LGA lead that provides a ground voltage. When the array capacitor 200 is placed in a system such as that illustrated in FIG. 1, a second plurality of the conductive planes 250 may be electrically coupled to a supply voltage. For example, the first plurality of conductive planes 250 may be coupled to pad 222. Pad 222 may interface with a LGA lead that provides a supply voltage. For example, a supply voltage may be at a voltage level utilized by an integrated circuit coupled to the array capacitor. Each plane may have vias 260 to allow for interconnection between layers and to allow for connection to the appropriate contact pads. The embodiment illustrated shows one pad 222 which may be utilized for supply voltage and one pad 220 which may be utilized for ground voltage. In various embodiments there may be a greater number of pads which may be utilized for supply voltage and/or pads which may be utilized for ground voltage.

Figure 3:
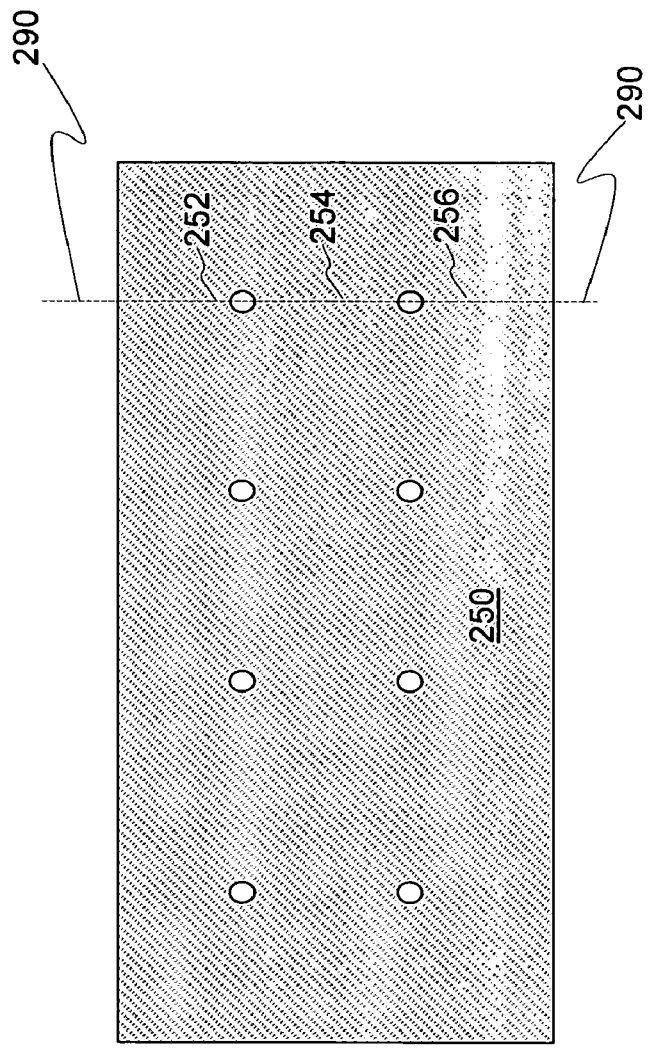
FIG. 3 illustrates a plan view of a conductive plane, in accordance with one embodiment.

As previously mentioned, FIG. 2 illustrates a cross sectional view of the array capacitor. However, this two dimensional view may be limiting in illustrating the electrical interconnectedness of portions of a plane. That is, vias 260 in FIG. 2 may provide the false appearance that there is no electrical coupling between conductive plane portions 252-256. FIG. 3 illustrates a plan view of a conductive plane 250, including a cut line 290 showing the cross sectional view of FIG. 2, in accordance with one embodiment. The three sections 252-256 are illustrated at the cut line 290. Thus, it can be seen that, although in FIG. 2 it does not appear that conductive plane portions 252 254 of conductive plane 250 are electrically coupled, they are electrically coupled. Further, pads 212 and 216, as briefly described earlier, are electrically and conductively coupled to the same set of conductive planes 250 through vias.

As previously discussed, the addition of the array capacitor may contribute to providing for alternative power paths to the integrated circuit. Refer again to the first path 107 and the second path 117 for the delivery of power to the integrated circuit 110. A substantial portion of the horizontal component of the power delivery for the first path 107 is provided through integrated circuit substrate 140. This is in contrast with the second path where most, if not all, of the horizontal component of the power delivery is through substrate 120. Integrated circuit substrate 140 may have routing resources which are limited when compared with the routing resources of substrate 120. Substrate 120 may be, for example, a printed circuit board with routing traces which may be many times wider than routing trace in integrated circuit substrate 140. This may provide a better ability to facilitate power delivery.

The use of an array capacitor that is closely disposed to the integrated circuit, may provide the ability for the array capacitor to provide current "on-demand" via the capacitive structure of the array capacitor. Referring again to the embodiment illustrated in FIG. 1, the system may be designed such that the array capacitor is situated on the opposite side of the package from the integrated circuit and directly below the integrated circuit. In this way, the distance from the integrated circuit to the array capacitor may be reduced. For example, in one embodiment, the trace distance between leads on an grid array and a bump on the integrated circuit may be only the distance through the integrated circuit substrate when there is no horizontal component to this trace. This may help in the provision of charge from the array capacitor to the integrated circuit in a shorter period of time. For example, when there is switching in the integrated circuit and there is a current draw on the system, the array capacitor may reduce the time that it takes to provide current to the integrated circuit as compared to the time that the current would take to arrive from a voltage regulator.

In various embodiments the array capacitor may be similarly sized, in various aspects, to that of the integrated circuit. For example, in one embodiment, the array capacitor may be coupled to an area on a bottom side of the integrated circuit substrate which is the same size as an area on a top side of the integrated circuit substrate that is occupied by the integrated circuit. In still other embodiments, capacitive capabilities having other capacitive structures may be employed instead.

Figure 4:
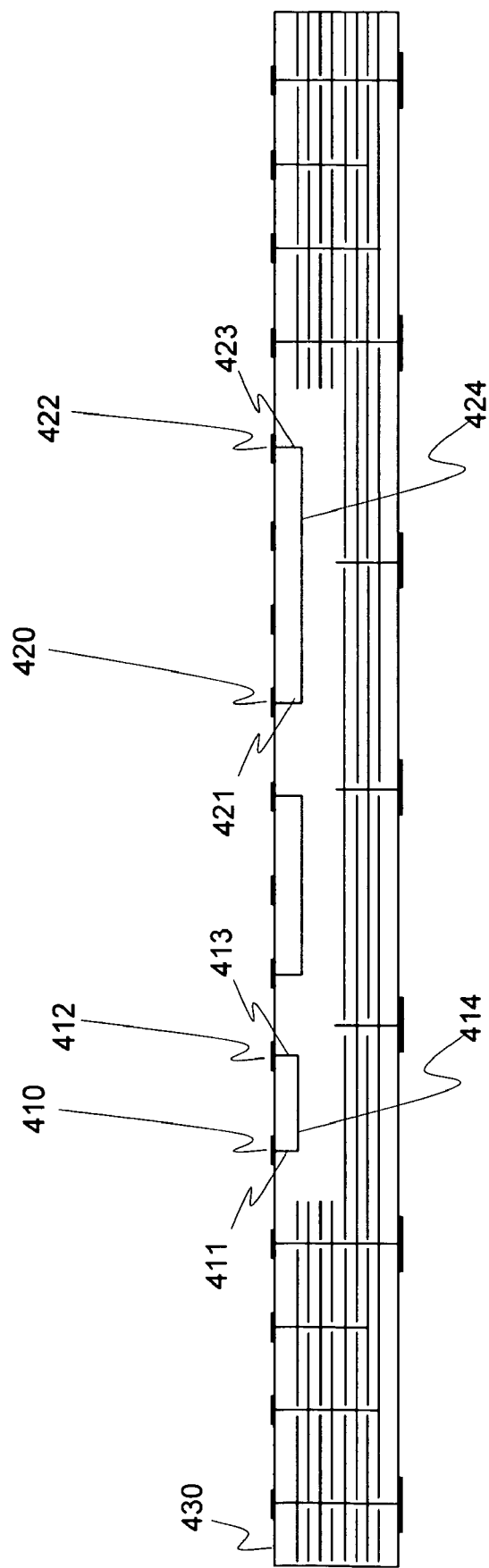
FIG. 4 illustrates a cross sectional view of an array capacitor with a resistive structure, in accordance with one embodiment.

FIG. 4 illustrates an array capacitor with a resistive structure, in accordance with one embodiment. In various embodiments of the array capacitor, portions of the array capacitor may be utilized to provide additional features besides providing capacitive structures. For example, a portion of an array capacitor may be utilized to provide resistive structures. A first pad 410 on a first side 430 of the array capacitor 400 may be coupled to a resistive structure. A second pad 412 on the first side 430 of the array capacitor 400 may be connected to the resistive structure. The resistive structure may be formed by connecting the two pads 410 412 to a trace 414 through vias 411 413.

The dimensions of various aspects of the resistive structure may determine the resistance of the resistive structures. For example, the resistive structure between pads 410 412 may provide a first resistance as defined by the dimensions of the trace 414, vias 411 413 and the resistivity of the material or materials used in the trace and vias. Another pair of pads 420 422 may be utilized to provide another resistive structure. Pads 420 422 are coupled to another line 424 through vias 421 423; the combination of pads 420 422, vias 421 423 and trace 424 provide a second resistance. Thus, in the embodiment illustrated, assuming similar cross section dimensions and resistivity of material for the traces, the amount of resistance may be controlled by the length of the traces.

Figure 5:
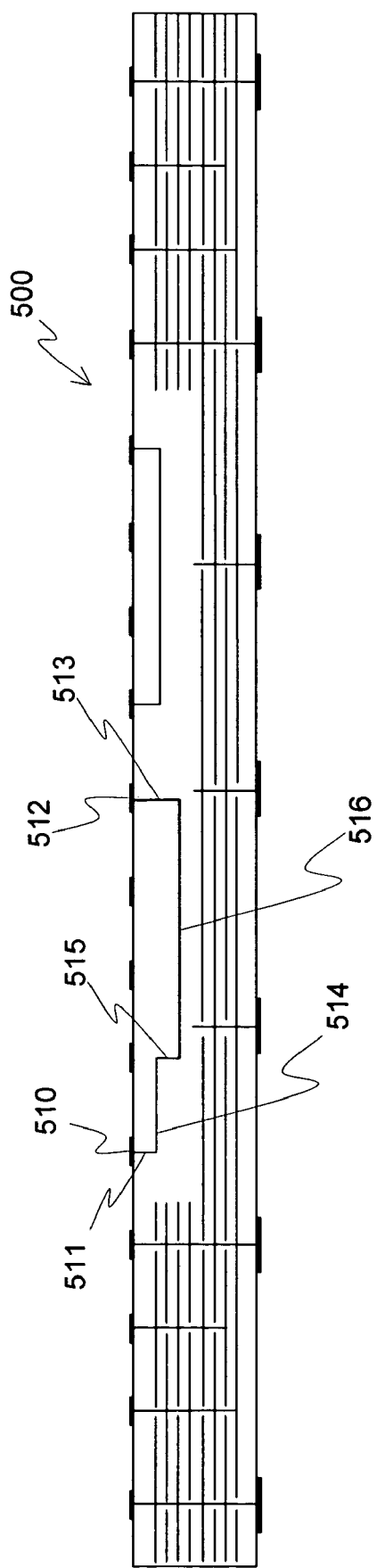
FIG. 5 illustrates a cross sectional view of an array capacitor with a resistive structure, in accordance with another embodiment.

FIG. 5 illustrates a cross sectional view of an array capacitor with resistive structure, in accordance with another embodiment. In various embodiments, different resistive structures may be formed. For example, a targeted resistance may be established by providing a resistive structure that comprises several traces on one or more layers of an array capacitor connected by several vias. Illustrated in the embodiment of FIG. 5 a resistive structure is coupled to two pads 510 512. The resistive structure comprises a first via 511 coupled to a first pad 510 and a first trace 514 on a first layer of the array capacitor 500. First trace 514 is coupled to a second trace 516 on a second layer through a via 515. The second trace 515 is coupled to a second pad 512 through via 513 traversing both layers.

The resistive structures in the array capacitor may be useful in providing resistance at several interfaces. In one embodiment, on a first side of an array capacitor with resistive structures, an interface to a resistive structure may be to an integrated circuit. Such a resistive structure may be utilized by the integrated circuit, for example, to provide an increase in performance for the integrated circuit. In another embodiment, on a second side of the array capacitor with resistive structures, an interface to a resistive structure may be to a substrate. Such a resistive structure may be utilized, for example, to replace a discrete resistor that may otherwise need to be mounted on the substrate. Thus, for example, when the array capacitor is coupled to a motherboard, the resistive structure may be utilized to replace a discrete resistor that would otherwise be mounted on the motherboard.

Figure 6:
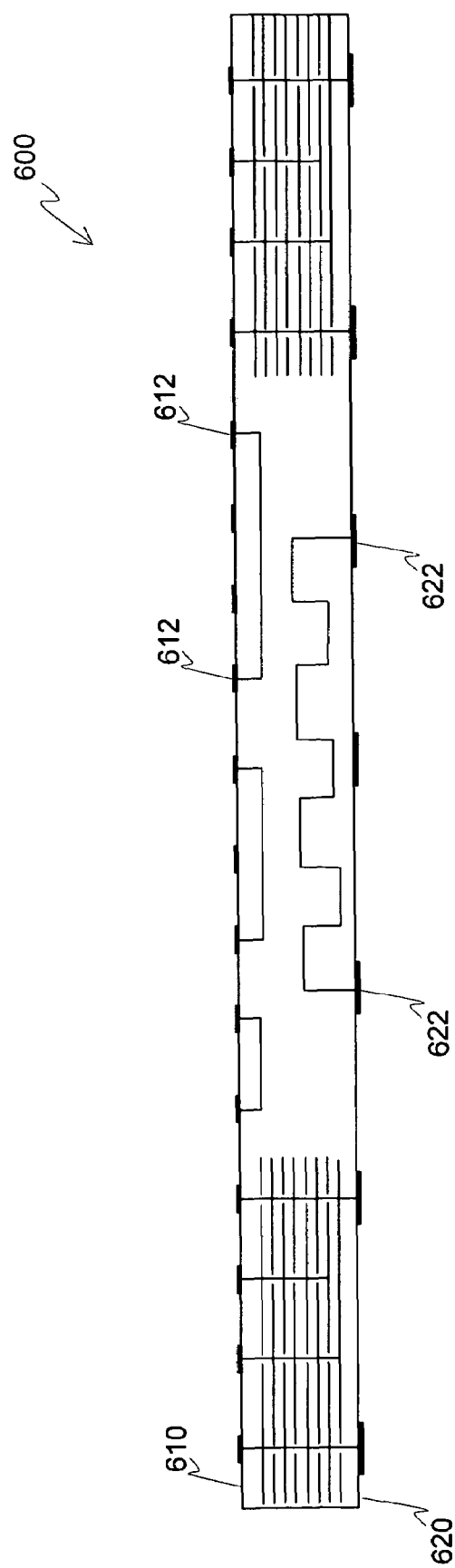
FIG. 6 illustrates a cross sectional view of an array capacitor with a resistive structure, in accordance with yet another embodiment.

FIG. 6 illustrates a cross sectional view of an array capacitor with resistive structures, in accordance with yet another embodiment. As previously discussed, the array capacitor may contain a first resistive structure coupled to pads 612 on a first side 610 of the array capacitor 600. These pads may be adapted to be coupled to an integrated circuit. The array capacitor may include a second resistive structure coupled to pads 622 on a second side 620 of the array capacitor 600. These pads 622 may be adapted to be coupled to a substrate. For example, refer again to FIG. 1 illustrating a portion of a system including an array capacitor coupled to a substrate. The array capacitor of FIG. 1 may include resistive structures as discussed above, in addition to capacitive structures shown in FIG. 1. Thus, a second side of the array capacitor may be coupled to a substrate such as that of substrate 140. In one embodiment, the resistive structure of the array capacitor coupled to the substrate may be utilized as a resistor in lieu of utilizing a discrete resistor which would otherwise be coupled to the substrate.

Figure 7:
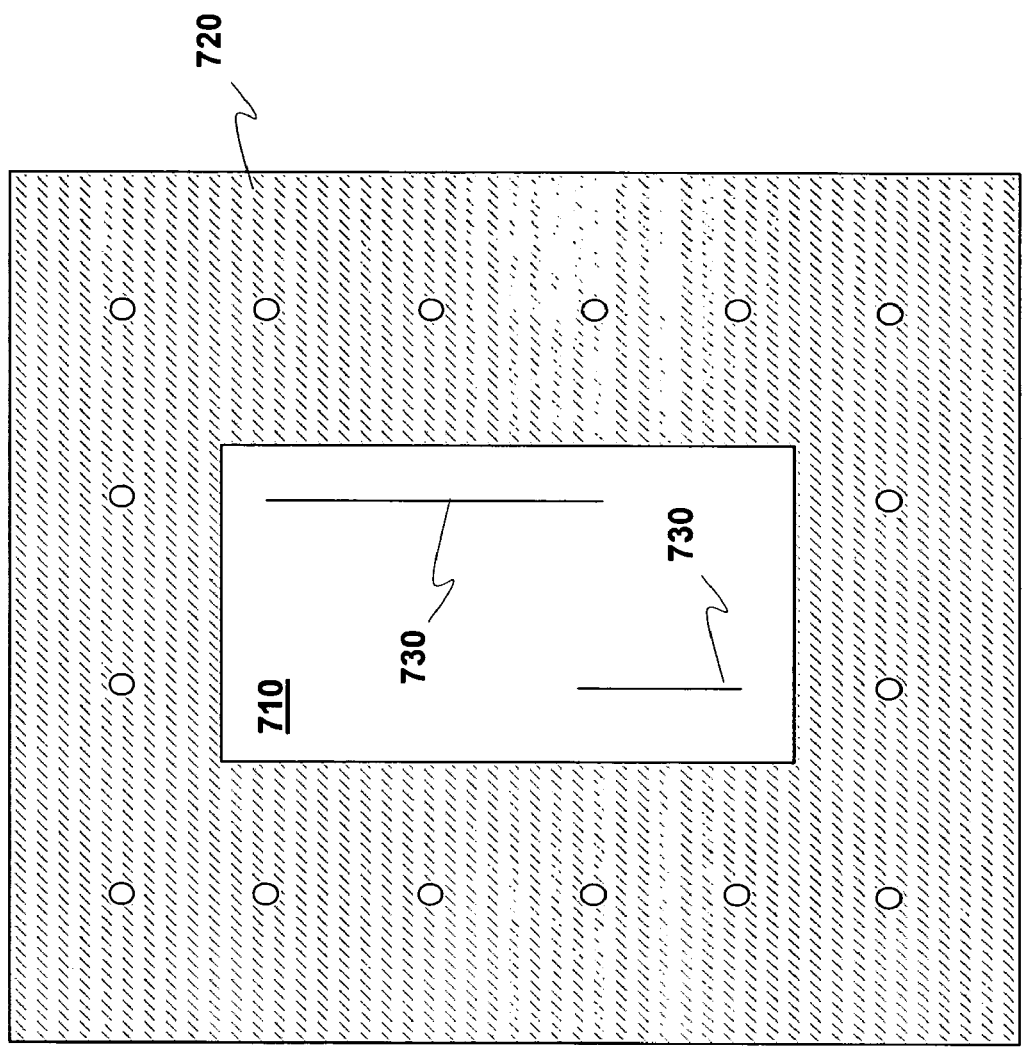
FIG. 7 shows a plan view of a layer of the array capacitor with a portion of the area allocated for resistive structures.

FIG. 7 shows a plan view of a layer of the array capacitor with a portion of the area dedicated to resistive structures. The layer comprises a metal plane 720 which may provide a capacitive structure for either a power or ground supply voltage for an integrated circuit as previously discussed. The metal plane 720 comprises a void area 710. This void area may be patterned with traces 730 to provide at least a portion of the resistive structures as discussed above.

Figure 8:
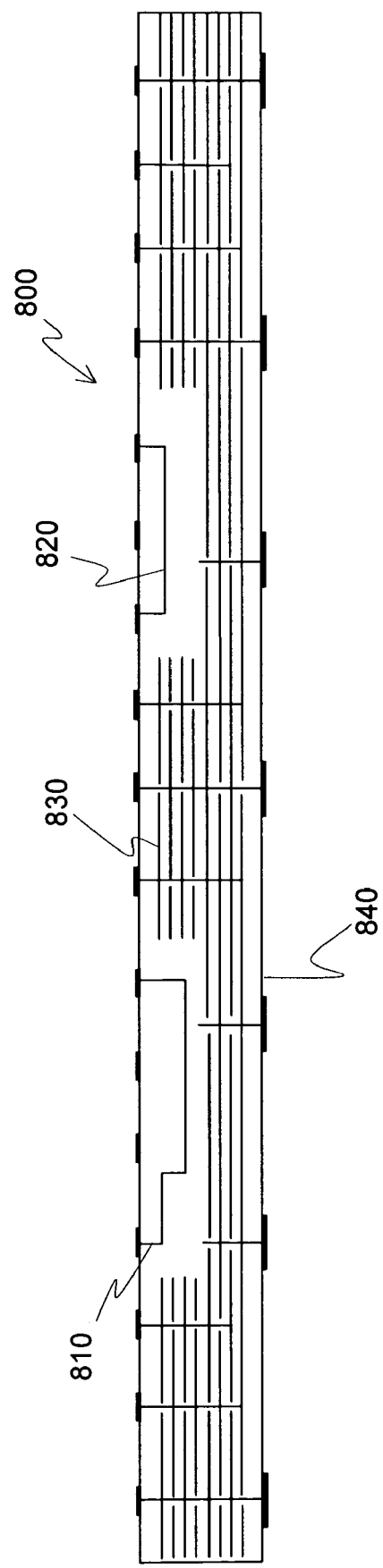
FIG. 8 illustrates a cross sectional view of an array capacitor 800 with resistive structures, in accordance with yet another embodiment.

FIG. 8 illustrates a cross sectional view of an array capacitor 800 with resistive structures, in accordance with yet another embodiment. In this embodiment, two resistive structures 810 820 are illustrated. Note that these two resistive structures are separated by a region of capacitive structures 830. Thus, in various embodiments the resistive structures may be placed at convenient locations and do not need to be dedicated to a single region. Note that while FIG. 8 illustrates resistive structures separated by capacitive structures coupled to pads on the integrated circuit side of the array capacitor, resistive structures separated by capacitive structures may be coupled to pads on the substrate side 840 of the array capacitor (not illustrated). Alternatively, the resistive structures may be coupled to pads on both the substrate and integrated circuit sides of the array capacitor.

Figure 9:
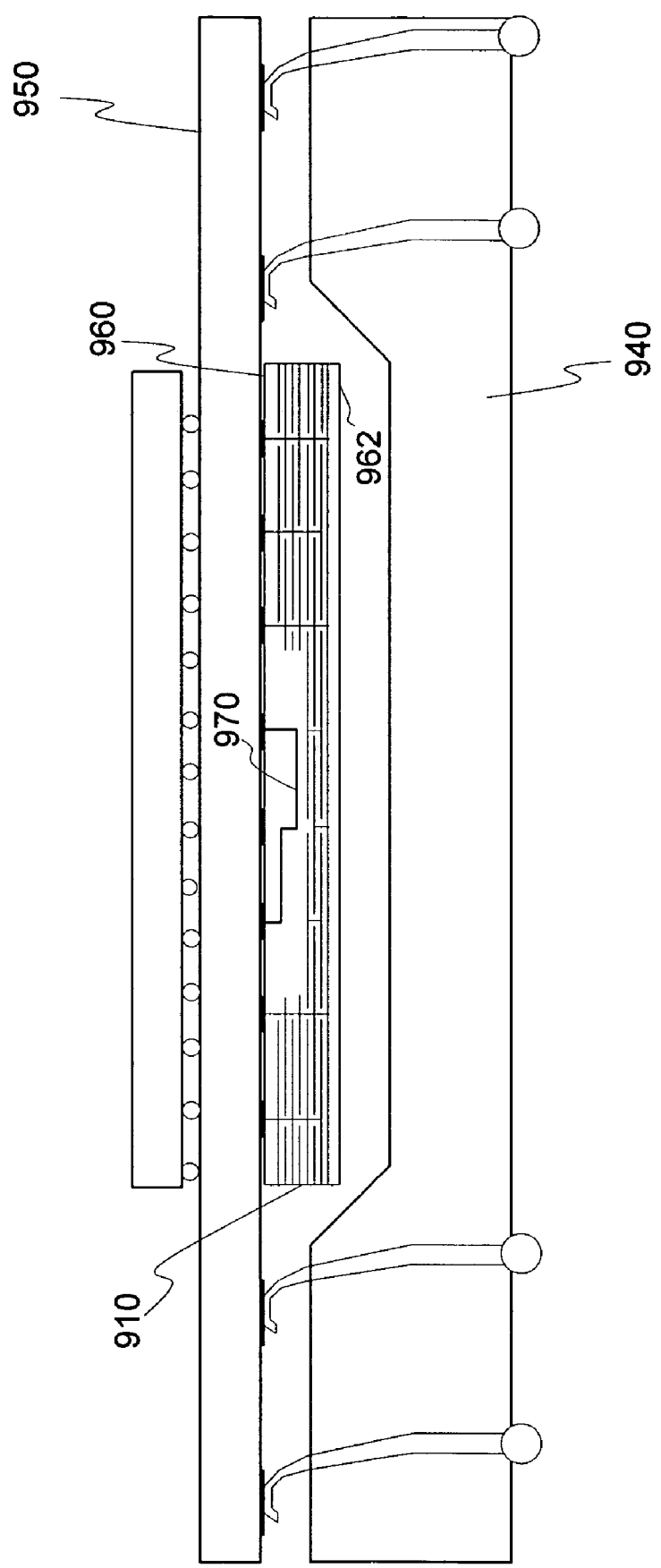
FIG. 9 illustrates a portion of a system utilizing an array capacitor 910 including a resistive structure 970, in accordance with one embodiment.

FIG. 9 illustrates a portion of a system utilizing an array capacitor 910 including a resistive structure 970, in accordance with one embodiment. In the embodiment illustrated, in contrast to the other embodiments illustrating a resistive structure in the array capacitor 910, the array capacitor has pads on only one side 960. The pads exist on the side 960 of the array capacitor interfacing with the integrated circuit package 950. In the embodiment illustrated, there are no pads on the side 962 of the array capacitor 910 opposing the land grid array socket 940.

Figure 10:
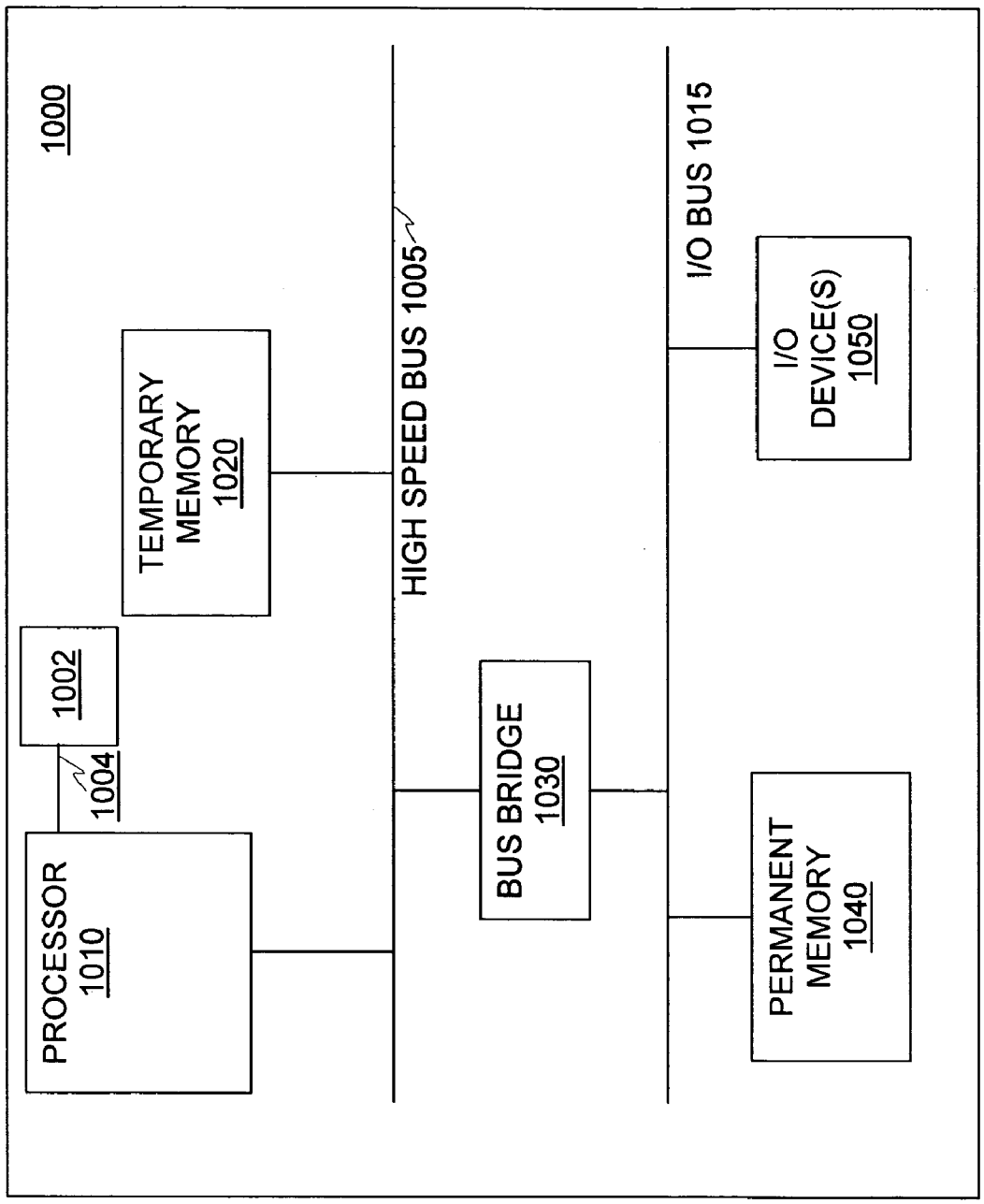
FIG. 10 illustrates is a block diagram of an electronic system including a which may utilize an array capacitor with a resistive structures.

FIG. 10 illustrates is a block diagram of an electronic system 1000 including a packaging arrangement which may utilize an array capacitor which includes a resistive structure. As shown, the system 1000 includes a processor 1010 and temporary memory 1020, such as SDRAM and DRAM, on high-speed bus 1005. Voltage regulator 1002 may be utilized to provide power to processor 1010 via traces 1004. The High-speed bus is connected through bus bridge 1030 to input/output (I/O) bus 1015. I/O bus 1015 connects permanent memory 1040, such as flash devices and mass storage device (e.g. fixed disk device), and I/O devices 1050 to each other and bus bridge 1030.

In various embodiments, system 1000 may be a hand held computing device, a mobile phone, a digital camera, a tablet computer, a laptop computer, a desktop computer, a set-top box, a CD player, a DVD player, or a server.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. It is to be recognized that other devices may be utilized without deviating from the scope of the embodiments presented herein. This application is intended to cover any adaptations or variations of the embodiments discussed herein. Therefore, it is manifestly intended that this invention be limited only by the claims and the equivalents thereof.

What is claimed is:

1. An apparatus comprising:
    a first contact of a first plurality of contacts disposed on a first side of the apparatus, adapted to engage with a first corresponding contact of a first plurality of contacts on an external integrated circuit package;
    a plurality of capacitive storage planes conductively coupled to the first contact of the first plurality of contacts;
    one or more traces; and
    a second plurality of contacts disposed on the first side, and adapted to engage with a second corresponding plurality of contacts on the external integrated circuit package, wherein at least two of the second plurality of contacts are adapted to be coupled to at least a first trace of the one or more traces to form a first resistive structure.

2. The apparatus of claim 1 further comprising a third plurality of contacts disposed on a second side of the apparatus, adapted to engage with a first corresponding plurality of external grid array leads.

3. The apparatus of claim 2 further comprising a fourth plurality of contacts disposed on the second side, and adapted to engage with a second corresponding plurality of external grid array leads, wherein at least two of the fourth plurality of contacts are adapted to be coupled to at least a second trace of the one or more traces to form a second resistive structure.

4. The apparatus of claim 3 wherein the at least a second of the one or more traces comprises the second trace disposed in a first layer of the apparatus and a third trace disposed in a second layer of the apparatus.

5. The apparatus of claim 4 wherein the apparatus further comprises a plurality of vias through which the second and third traces pass to couple to the at least two of the fourth plurality of contacts.

6. The apparatus of claim 1 wherein the first plurality of contacts disposed on the first side of the apparatus includes a second contact that is conductively coupled to the plurality of capacitive storage planes.

7. The apparatus of claim 1 wherein the one or more traces comprise a plurality of traces, and the at least a first trace of the one or more traces comprises the first trace and a second trace of the plurality of traces.

8. The apparatus of claim 7 wherein the first trace is disposed in a first layer of the apparatus and the second trace is disposed in a second layer of the apparatus.

9. The apparatus of claim 7 wherein the apparatus further comprises a plurality of vias through which the first and second of the plurality of traces pass to couple to the at least two of the second plurality of contacts.

10. The apparatus of claim 1 wherein the apparatus comprises a plurality of vias through which the at least a first of the one or more traces passes to couple to the at least two of the second plurality of contacts.

11. An apparatus comprising:
an integrated circuit package;
an integrated circuit coupled to the integrated circuit package; and
an array capacitor coupled to the integrated circuit package, the array capacitor comprising:
a first contact of a first plurality of contacts disposed on a first side of the array capacitor, adapted to engage with a first corresponding contact of a first plurality of contacts on the integrated circuit package;
a plurality of capacitive storage planes conductively coupled to the first contact of the first plurality of contacts;
one or more traces; and
a second plurality of contacts disposed on the first side, and adapted to engage with a second corresponding plurality of contacts on the integrated circuit package, wherein at least two of the second plurality of contacts are adapted to be coupled to at least a first trace of the one or more traces to form a first resistive structure.

12. The apparatus of claim 11 further comprising a third plurality of contacts disposed on a second side of the array capacitor, adapted to engage with a first corresponding plurality of external grid array leads.

13. An apparatus comprising:
an integrated circuit package;
an integrated circuit coupled to the integrated circuit package; and
an array capacitor coupled to the integrated circuit package, the array capacitor comprising:
a first plurality of contacts disposed on a first side of the array capacitor, adapted to engage with a first corresponding plurality of contacts on the integrated circuit package;
a plurality of capacitive storage structures selectively coupled to the first plurality of contacts;
one or more traces; and
a second plurality of contacts disposed on the first side, and adapted to engage with a second corresponding plurality of contacts on the integrated circuit package, wherein at least two of the second plurality of contacts are adapted to be coupled to at least a first trace of the one or more traces to form a first resistive structure;
a third plurality of contacts disposed on a second side of the array capacitor, adapted to engage with a first corresponding plurality of external grid array leads; and
a land grid array socket, comprising the external grid array leads, coupled to the array capacitor.

14. The apparatus of claim 13 wherein the external grid array leads comprises a first and a second subset of external land grid array leads wherein the first subset of external land grid array leads comprise a first dimension and the second subset of land grid array leads comprises a second dimension wherein the second subset of external land grid array leads are adapted to engage with the third plurality of contacts.

15. The apparatus of claim 12 further comprising a fourth plurality of contacts disposed on the second side, and adapted to engage with a second corresponding plurality of external grid array leads, wherein at least two of the fourth plurality of contacts are adapted to be coupled to at least a second trace of the one or more traces to form a second resistive structure.

16. The apparatus of claim 11 wherein the first plurality of contacts disposed on the first side of the apparatus includes a second contact that is conductively coupled to the plurality of capacitive storage plane.

17. The apparatus of claim 1, wherein the plurality of capacitive storage planes are conductively coupled to the first contact of the first plurality of contacts through a via.

18. The apparatus of claim 6, wherein the first and the second contact of the first plurality of contacts disposed on the first side of the apparatus are conductively coupled to the plurality of capacitive storage planes through a first and a second via, respectively.

19. The apparatus of claim 1, wherein each of the plurality of capacitive storage planes are disposed in parallel with other ones of the plurality of capacitive storage planes.

20. The apparatus of claim 11, wherein the plurality of capacitive storage planes are conductively coupled to the first contact of the first plurality of contacts through a via.

21. The apparatus of claim 16, wherein the first and the second contact of the first plurality of contacts disposed on the first side of the apparatus are conductively coupled to the plurality of capacitive storage planes through a first and a second via, respectively.

22. The apparatus of claim 11, wherein each of the plurality of capacitive storage planes are disposed in parallel with other ones of the plurality of capacitive storage planes.

* * * * *